United States Patent
Camacho et al.

(10) Patent No.: US 8,415,205 B2
(45) Date of Patent: Apr. 9, 2013

(54) INTEGRATED CIRCUIT PACKAGING SYSTEM WITH LEAD INTERLOCKING MECHANISMS AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 316 days.

(21) Appl. No.: 12/961,494

(22) Filed: Dec. 6, 2010

(65) Prior Publication Data

US 2011/0169151 A1 Jul. 14, 2011

Related U.S. Application Data

(60) Provisional application No. 61/294,474, filed on Jan. 12, 2010.

(51) Int. Cl.
*H01L 21/44* (2006.01)
*H01L 21/48* (2006.01)
*H01L 21/50* (2006.01)
*H01L 23/495* (2006.01)

(52) U.S. Cl.
USPC ............... 438/123; 257/676; 257/E21.502; 257/E23.031

(58) Field of Classification Search .................. 438/123; 257/676, E21.502, E23.031
See application file for complete search history.

(56) References Cited

U.S. PATENT DOCUMENTS

| | | | |
|---|---|---|---|
| 6,201,292 B1 | 3/2001 | Yagi et al. | |
| 6,483,178 B1 | 11/2002 | Chuang | |
| 7,119,421 B2 | 10/2006 | Rohrmoser et al. | |
| 7,276,803 B2 | 10/2007 | Stecher et al. | |
| 7,622,332 B2 | 11/2009 | Islam et al. | |
| 7,652,357 B2 | 1/2010 | Wang et al. | |
| 7,799,611 B2 | 9/2010 | Ramos et al. | |
| 8,039,947 B2 * | 10/2011 | Punzalan et al. | 257/692 |
| 2009/0283893 A1 | 11/2009 | Do et al. | |
| 2011/0049690 A1 * | 3/2011 | Cho | 257/676 |

OTHER PUBLICATIONS

U.S. Appl. No. 12/944,351, filed Nov. 11, 2010, Do et al.

* cited by examiner

*Primary Examiner* — David S Blum
(74) *Attorney, Agent, or Firm* — Ishimaru & Associates LLP

(57) ABSTRACT

A method of manufacture of an integrated circuit packaging system includes: forming a lead having an upper portion and a bottom portion with a first overhang portion from a top surface of the upper portion and the lead also having serrations along upper vertical sides intersecting the top surface; forming an upper contact plate on the top surface; forming a bottom contact plate on a bottom surface of the bottom portion; attaching an integrated circuit die over the upper portion; and encapsulating the upper portion and the integrated circuit die with an encapsulation leaving the bottom portion exposed.

20 Claims, 6 Drawing Sheets

INTEGRATED CIRCUIT PACKAGING SYSTEM WITH LEAD INTERLOCKING MECHANISMS AND METHOD OF MANUFACTURE THEREOF

CROSS-REFERENCE TO RELATED APPLICATION

This application claims the benefit of U.S. Provisional Patent Application Ser. No. 61/294,474 filed Jan. 12, 2010, and the subject matter thereof is incorporated herein by reference thereto.

TECHNICAL FIELD

The present invention relates generally to an integrated circuit packaging system, and more particularly to a system for an integrated circuit packaging system with lead interlocking mechanisms.

BACKGROUND ART

Current semiconductor packaging technology often involves tradeoffs between ease and efficiency of manufacturing on the one hand, and various performance drawbacks on the other. For example, lead-frame based packages such as quad flat no-lead (QFN) packages employ lead-frames to facilitate the packaging and singulation of multiple units at once.

The lead-frame approach is desirable due to the reduced cost, but the close proximity of solder contacts has lead to fabrication problems due to solder shorts. The contact reliability is reduced if the packages must be removed to repair solder shorts.

However, lead-frame based packages, whose connectors are typically placed either on or extending from the sides, tend to have larger footprints than ball grid array (BGA) packages, whose solder ball connectors lie directly underneath the package. Unfortunately, BGA packages have drawbacks as well. Specifically, such packages often employ laminate substrates rather than uniform metal lead-frames, making them more expensive to produce than lead-frame based packages, and less efficiently manufactured.

It is therefore desirable to design packages that employ lead-frames for ease and efficiency of manufacture, but that also have BGA-type solder ball connectors for reduced footprint sizes. In light of the increased requirements for package cost and reliability, it is further desirable to improve various aspects of the design and manufacture of these packages.

An aspect of the prior art designs is a tendency for the leads or contacts to become loose and pull out of the package. In some cases, the contact may become free of the package molding material and form cracks that can make for unreliable contacts. These issues may show up as manufacturing yield problems or early life failures of the circuit package.

Thus, a need still remains for an integrated circuit packaging system with leadless contacts for increased reliability of connection without rework risk. In view of the demand for packages having a high density of contact connections, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead having an upper portion and a bottom portion with a first overhang portion from a top surface of the upper portion and the lead also having serrations along upper vertical sides intersecting the top surface; forming an upper contact plate on the top surface; forming a bottom contact plate on a bottom surface of the bottom portion; attaching an integrated circuit die over the upper portion; and encapsulating the upper portion and the integrated circuit die with an encapsulation leaving the bottom portion exposed.

The present invention provides an integrated circuit packaging system including: a lead having an upper portion and a bottom portion with a first overhang portion from a top surface of the upper portion and the lead also having serrations along upper vertical sides intersecting the top surface; an upper contact plate on the top surface; a bottom contact plate on a bottom surface of the bottom portion; an integrated circuit die mounted over the upper portion; and an encapsulation covering the upper portion and the integrated circuit die with the encapsulation leaving the bottom portion exposed.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
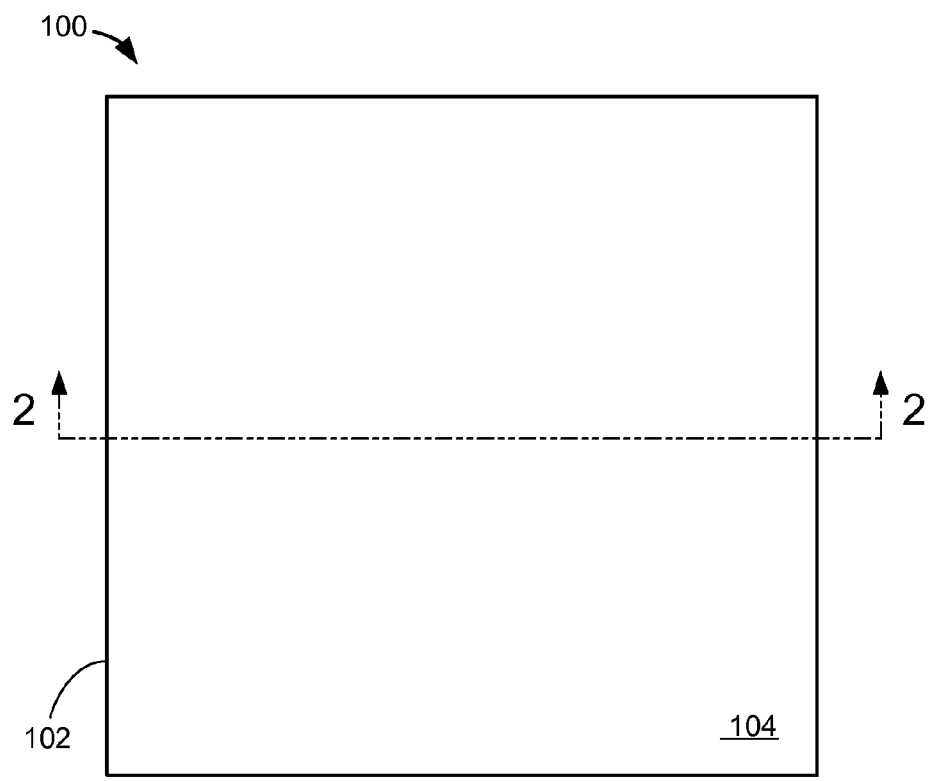
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102, which is a cover for the integrated circuit packaging system 100 including an epoxy molding compound. The encapsulation 102 can have a first side 104.

For illustrative purposes, the integrated circuit packaging system 100 is shown with the encapsulation 102 having a square geometric configuration, although it is understood that the encapsulation 102 can have a different geometric configuration. For example, the integrated circuit packaging system 100 can have the encapsulation 102 with a rectangular geometric configuration, or a configuration having non-perpendicular corners.

Figure 2:
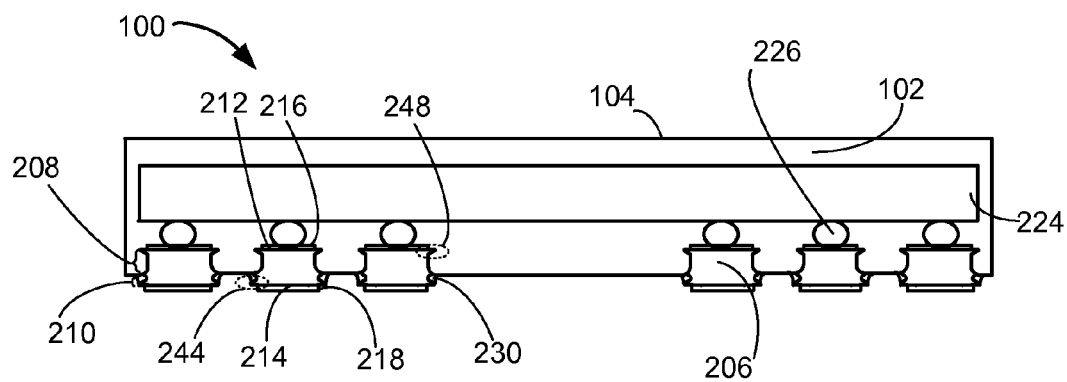
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. Leads 206 are conductive structures, such as copper structures. The leads 206 can include an upper portion 208, a bottom portion 210, a top surface 212, and a bottom surface 214.

The upper portion 208 of each of the leads 206 is above the bottom portion 210 of each of the leads 206. The upper portion 208 can be within the encapsulation 102. The bottom portion 210 can be exposed from the encapsulation 102.

The top surface 212 of each of the leads 206 is the upper most surface of each of the leads 206. The top surface 212 can be planar. An upper contact plate 216 can be on the top surface 212. The bottom surface 214 of each the leads 206 is at the side opposite to the top surface 212 of each of the leads 206. The bottom surface 214 can be planar. A bottom contact plate 218 can be on the bottom surface 214.

A first overhang portion 248 can form from the top surface 212 of the upper portion 208. The first overhang portion 248 overhangs over the top portion 248. A second overhang portion 244 can form from the bottom surface 214 of the bottom portion 210. The second overhang portion 244 overhangs over the bottom portion 210 on the side opposite to the first overhang portion 248.

The leads 206 can be plated or patterned with a first solder wettable material, such as gold, silver, or nickel, forming the upper contact plate 216. The bottom portion 210 of each of the leads 206 can be plated or patterned with a second solder wettable material, which can be similar to the first solder wettable material, forming the bottom contact plate 218. The upper contact plate 216 and the bottom contact plate 218 are conductive structures made from a different material than the leads 206.

The upper contact plate 216 and the bottom contact plate 218 can also be made from the same material. The upper contact plate 216 and the bottom contact plate 218 can be formed by a number of methods. The upper contact plate 216 and the bottom contact plate 218 can be formed by electroplating, or depositing and followed by patterning and etching.

An integrated circuit die 224, such as a flip chip, can be mounted on the upper portion 208 to each of the leads 206 by electrical interconnects 226. The electrical interconnects 226 are conductive interface structures providing electrical and mechanical connectivity to the integrated circuit die 224.

The integrated circuit die 224 is defined as a semiconductor device having active circuitry thereon. The integrated circuit die 224 is electrically connected to the leads 206 by the electrical interconnects 226, such as solder balls or solder pillars, which may be formed by reflowing a conductive adhesive.

The encapsulation 102 can enclose the upper portion 208 of each of the leads 206, the integrated circuit die 224, and the electrical interconnects 226. The bottom portion 210 of each of the leads 206 can partially or completely be exposed by the encapsulation 102.

A solder resistant layer 230 can be deposited onto the bottom portion 210 of each of the leads 206, excluding the bottom surface 214 covered by the bottom contact plate 218. The solder resistant layer 230 is a layer of a non-solder wettable material, such as solder resist or oxide. The solder resistant layer 230 can form a layer around the bottom portion 210 of each of the leads 206. The non-solder wettable material can function to prevent solder from attaching to its surface, thereby preventing solder creep and accidental shorts.

It has been discovered that the present invention provides the integrated circuit packaging system 100 having improved reliability. The solder resistant layer 230 serves to insulate the leads 206. The solder resistant layer 230 also serves to make sure that unwanted solder does not attach onto the leads 206 other than the bottom contact plate 218. Unwanted solder can short circuit a resulting package. The solder resistant layer 230 thereby improves reliability by preventing short circuits.

Figure 3:
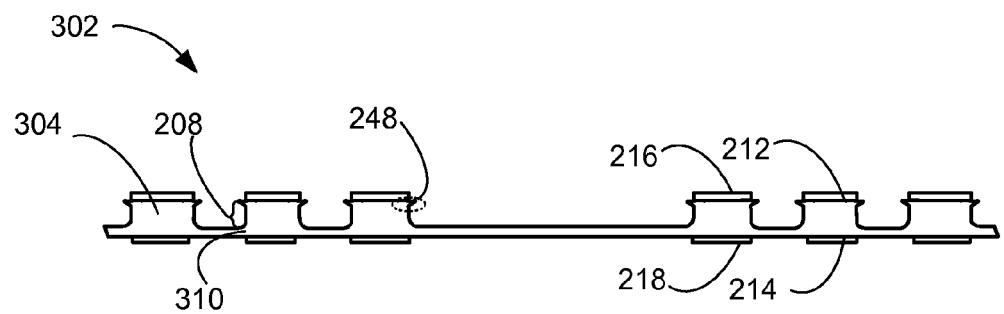
FIG. 3 is a cross-sectional view of an example of a lead frame in a lead forming phase of the integrated circuit packaging system.

Referring now to FIG. 3, therein is shown a cross-sectional view of an example of a lead frame 302 in a lead forming phase of the integrated circuit packaging system 100. The lead frame 302 is a metal or conductive frame. The lead frame 302 can include protrusions 304 separated by grooves for the purpose of forming leads at a later stage of manufacturing.

The protrusions 304 are portions within the lead frame 302 separated by grooves that can later be stamped, etched, or saw off to form the leads 206 of FIG. 2. Each of the protrusions 304 can include the upper portion 208, the top surface 212, and the bottom surface 214 as that of each of the leads 206 of FIG. 2. A bottom unetched portion 310 can be directly underneath each of the protrusions 304, similar to the bottom portion 210 of FIG. 2, except for that the bottom unetched portion 310 under each of the protrusions 304 is connected to one another.

The protrusions 304 can be formed by a partial stamping, partial etching, or a combination thereof, from the lead frame 302. When the protrusions 304 are stamped, the protrusions 304 have characteristics of a stamping process on its surface, such as a stamped surface, stamped corners, or a pressed metal surface. The protrusions 304 can also be formed by etching, which leaves characteristics of the etching process on the protrusion surfaces, such as an etched surface, chemical residue, or a chemically processed surface. The protrusions 304 can further be formed by sawing, which leaves characteristics of the sawing process on the protrusion surfaces, such as a sawed surface, abrasive saw patterns, or saw tooth marks.

The lead frame 302 can be a pre-plated frame, also known as a PPF. The PPF is a lead frame formed of a metal sheet, such as a copper sheet, with contact plates already in place. For example, the upper contact plate 216 can be formed on the locations of each of the protrusions 304. The bottom contact plate 218 can also be formed on the locations of each of the bottom unetched portion 310, which is under each of the protrusions 304. The bottom contact plate 218 and the upper contact plate 216 can also form on the protrusions 304 by other methods such as various types of metal deposition.

Figure 4:
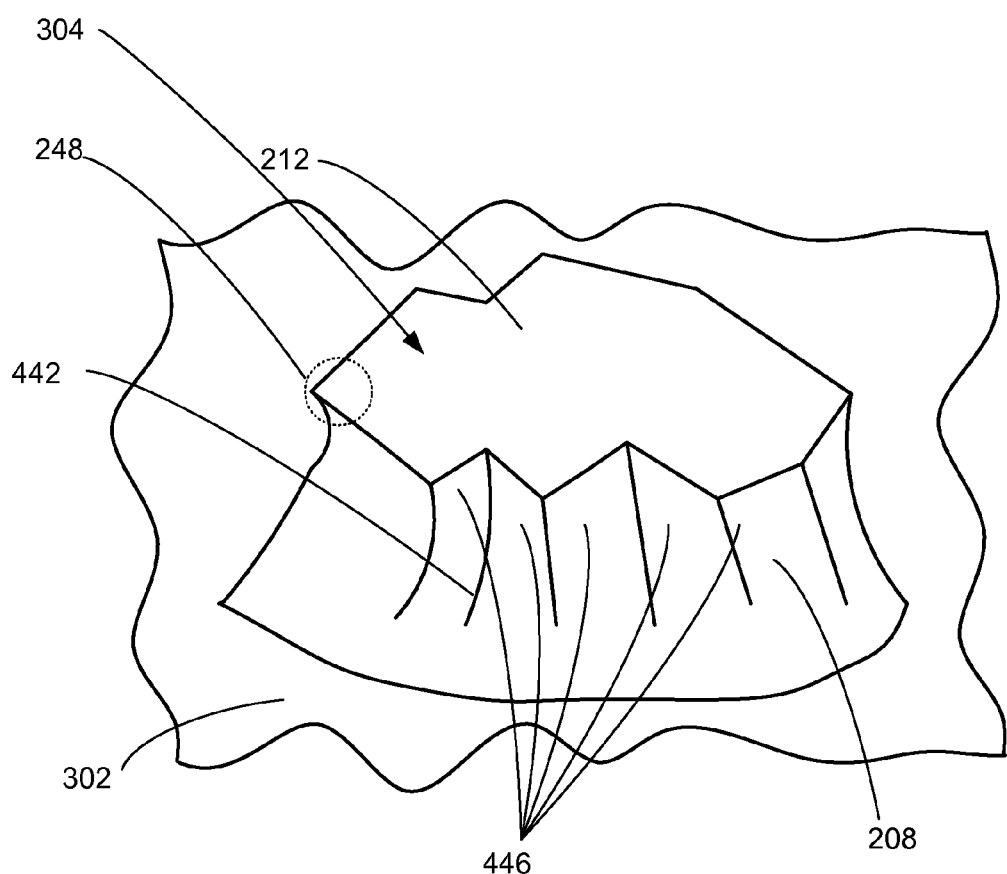
FIG. 4 is a top perspective view of an example of the upper portion of one of the protrusions formed on the lead frame of FIG. 3.

Referring now to FIG. 4, therein is shown a top perspective view of an example of the upper portion 208 of one of the protrusions 304 formed on the lead frame 302 of FIG. 3. The protrusions 304 are shown protruding out of the lead frame 302. The protrusions 304 are shown, for example, having a serrated contour with serrations 442 on the contour.

The upper portion 208 of each of the protrusions 304 can be formed having other contour shapes on the top surface 212, such as polygons, star shapes, or other contour shapes with the serrations 442. The serrations 442 can be, for example, triangular serrations. Each of the protrusions 304 can have the top surface 212. The upper portion 208 of each of the protrusions 304 can form a contour having more than four upper vertical sides 446 intersecting the top surface 212 of the leads 206.

The protrusions 304 can include the upper contact plate 216 of FIG. 2 having, for example, the same serrated contour shape as the upper portion 208 of the protrusions 304.

The protrusions 304 can include the first overhang portion 248. The first overhang portion 248 is part of each of the protrusions 304. The first overhang portion 248 is formed on each of the protrusions 304 during an etching process. Etching into the lead frame 302 to form the protrusions 304 having the serrations 442 introduces overhanging structures near the top surface 212 of the protrusions 304.

It has been discovered that the present invention provides the integrated circuit packaging system 100 having improved reliability. The upper portion 208 of each of the protrusions 304 may undergo encapsulation as further shown in the following figures. The contours with the serrations 442 described provide lateral interlocking with the encapsulation 102 of FIG. 1 by increasing the effective contact surface area of the leads 206 of FIG. 2. Lateral interlocking prevents the integrated circuit packaging system 100 from getting detached from the encapsulation 102, or from experiencing short circuits.

It has been also discovered that the present invention provides the integrated circuit packaging system 100 having improved delamination reliability. The contour shapes described for the upper portion 208 of the protrusions 304 creates the first overhang portion 248 of the protrusions 304 when the lead frame 302 undergoes etching. A multiplicity of the shapes, serrations, and overhang add up to effect an improvement in overall lead pull strength due to the additional interlocking with the encapsulation 102 of FIG. 1 thereby improving delamination reliability.

It has been further discovered that the present invention provides the integrated circuit packaging system 100 having improved delamination reliability. The upper contact plate 216 can also overhang over the protrusions 304, further providing vertical interlock. The serrations 442 of the protrusions 304 and the first overhang portion 248 of the protrusions 304 thereby increase the delamination reliability of the integrated circuit packaging system 100 by preventing detachment and short circuits.

Figure 5:
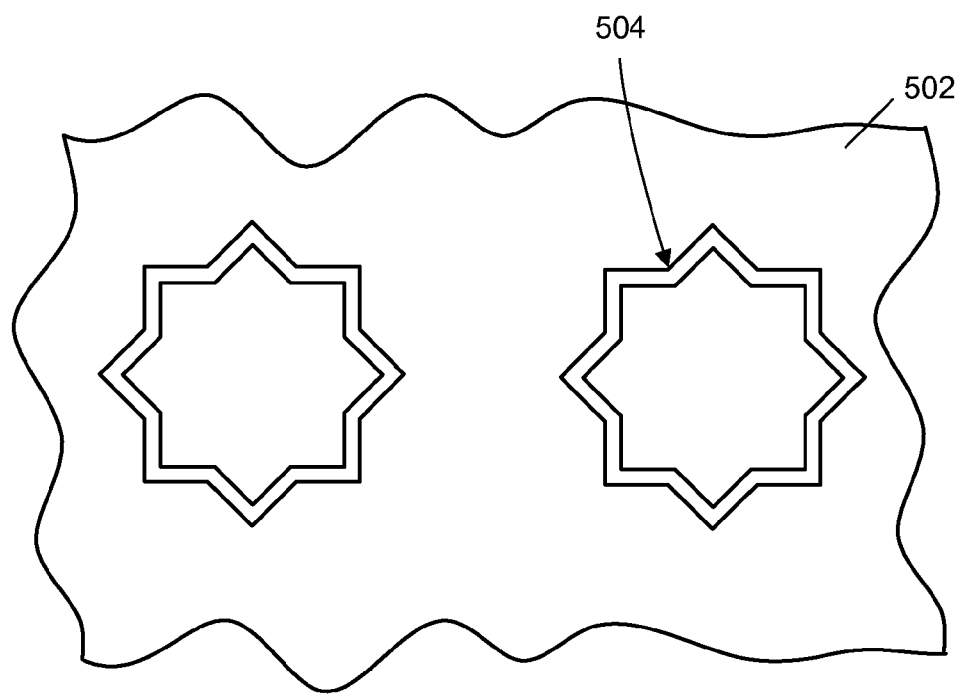
FIG. 5 is a top view of the protrusions similar to protrusions section of FIG. 4, in a second embodiment of the present invention.

Referring now to FIG. 5, therein is shown a top view of the protrusions 504 similar to protrusions section of FIG. 4, in a second embodiment of the present invention. The protrusions 504 are shown protruding out of the lead frame 502. The protrusions 504 are shown, for example, having an eight-point star contour. Aside from the geometry of the protrusions 504 and the lead frame 502, the second embodiment of the present invention contains the same system and method as the integrated circuit packaging system 100 of FIG. 1.

Figure 6:
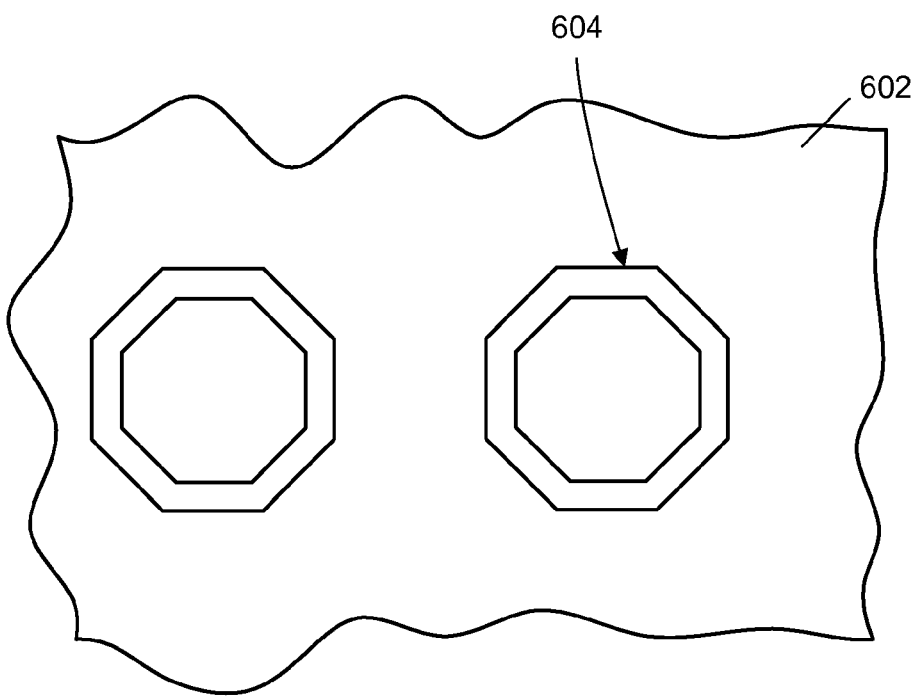
FIG. 6 is a top view of the protrusions of the protrusions section of FIG. 4, in a third embodiment of the present invention.

Referring now to FIG. 6, therein is shown a top view of the protrusions 604 of the protrusions section of FIG. 4, in a third embodiment of the present invention. The protrusions 604 are shown protruding out of the lead frame 602. The protrusions 604 are shown, for example, having an octagon contour shape. Aside from the geometry of the protrusions 604 and the lead frame 602, the third embodiment of the present invention contains the same system and method as the integrated circuit packaging system 100 of FIG. 1.

Figure 7:
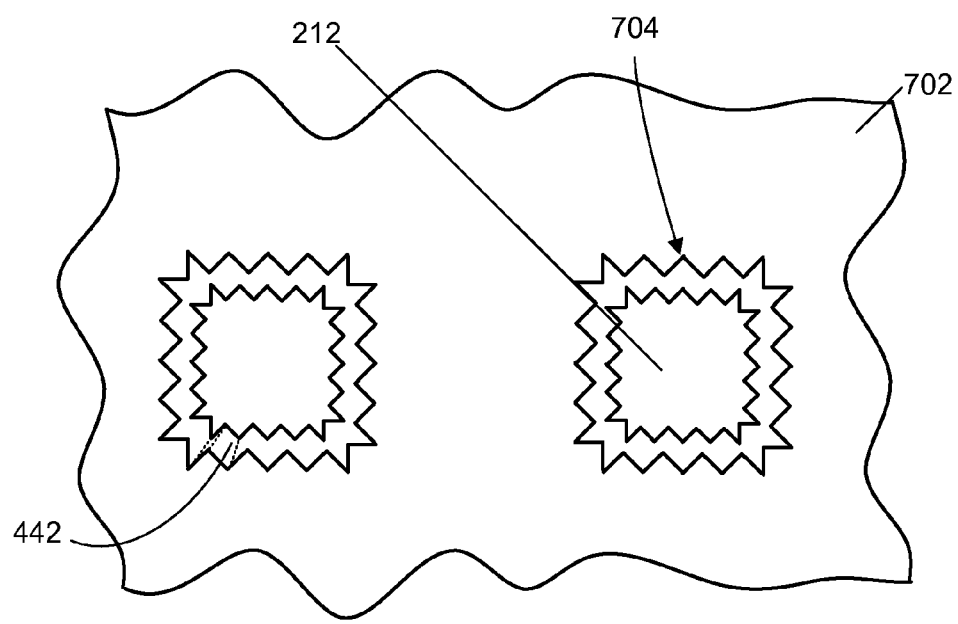
FIG. 7 is a top view of the protrusions of the protrusions section of FIG. 4, in a fourth embodiment of the present invention.

Referring now to FIG. 7, therein is shown a top view of the protrusions 704 of the protrusions section of FIG. 4, in a fourth embodiment of the present invention. The protrusions 704 are shown protruding out of the lead frame 702. The protrusions 704 are shown, for example, having a jagged rectangular contour shape. Each of the protrusions 704 has the serrations 442, such as triangular serrations, extending from the lead frame 702 to the top surface 212 of each of the protrusions 704. Aside from the geometry of the protrusions 704 and the lead frame 702, the fourth embodiment of the present invention contains the integrated circuit packaging system 100 of FIG. 1.

Figure 8:
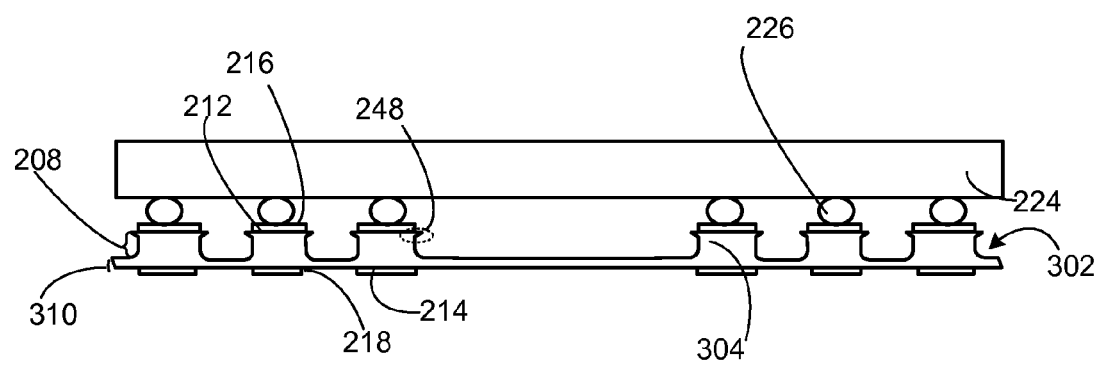
FIG. 8 is a cross-sectional view of the integrated circuit packaging system in a mounting phase of manufacturing.

Referring now to FIG. 8, therein is shown a cross-sectional view of the integrated circuit packaging system 100 in a mounting phase of manufacturing. The integrated circuit die 224 is mounted on the lead frame 302. The electrical interconnects 226, such as solder balls, couple the integrated circuit die 224 to the upper portion 208 of each of the protrusions 304 via the upper contact plate 216.

Figure 9:
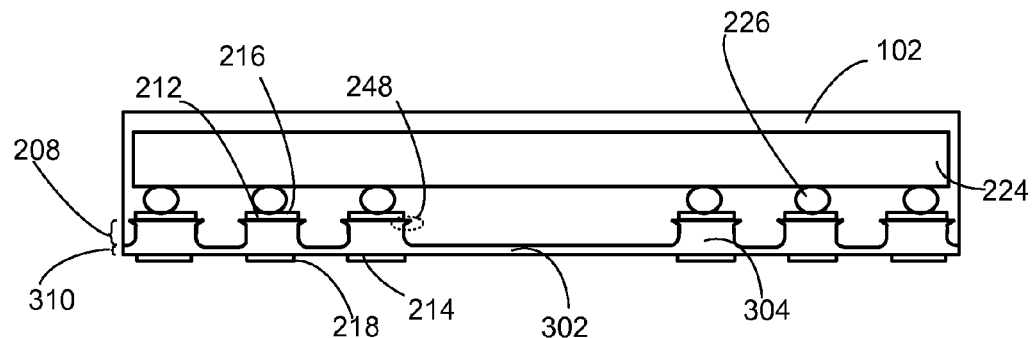
FIG. 9 is a cross-sectional view of the integrated circuit packaging system in an encapsulation phase of manufacturing.

Referring now to FIG. 9, therein is shown a cross-sectional view of an integrated circuit packaging system 100 in an encapsulating phase of manufacturing. The encapsulation 102 can be formed on and surrounding the integrated circuit die 224, the upper portion 208 of each of the protrusions 304, and the electrical interconnects 226. The encapsulation 102 can partially surround the lead frame 302 leaving the bottom unetched portion 310 under each of the protrusions 304 exposed. The encapsulation 102 can go through a curing process.

The interlocking mechanisms introduced for the protrusions 304 of FIG. 4, as well as other embodiments, becomes effective in this stage of manufacturing to prevent the encapsulation 102 of FIG. 1 from detaching or cracking.

Figure 10:
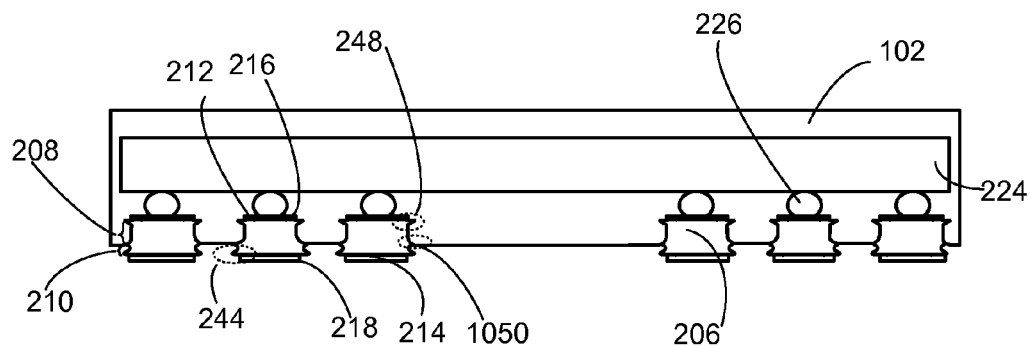
FIG. 10 is a cross-sectional view of the integrated circuit packaging system in an etching phase of manufacturing.

Referring now to FIG. 10, therein is shown a cross-sectional view of the integrated circuit packaging system 100 in an etching phase of manufacturing. The bottom portion 210 of each of the protrusions 304 of FIG. 3 can be etched to remove metal regions of the lead frame 302 of FIG. 3 between the bottom portion 210 of each of the protrusions 304, forming the leads 206.

The encapsulation 102 can be exposed between the leads 206 after etching, electrically isolating the leads 206. The bottom portion 210 and the upper portion 208 of each of the protrusions 304 remains in the same location as the bottom portion 210 and the upper portion 208 of each of the leads 206 respectively. A protrusive extension 1050 can form during the etching process as part of the interface between the bottom portion 210 and the upper portion 208 of the leads 206. The protrusive extension 1050 is part of each of the leads 206. The protrusive extension 1050 can serve as an additional vertical interlocking mechanism.

Figure 11:
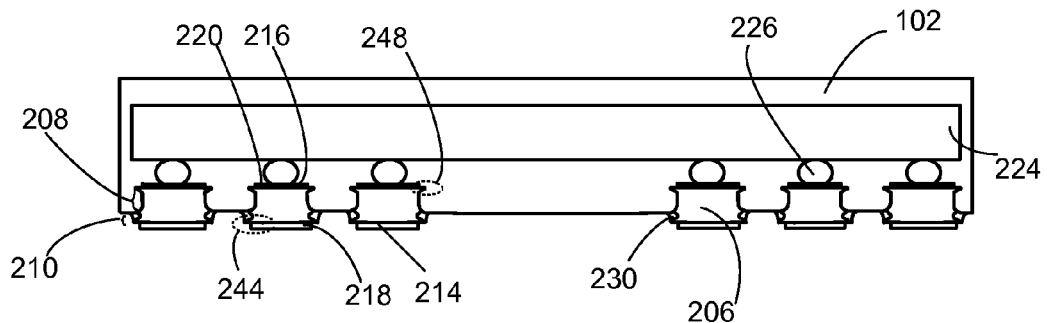
FIG. 11 is a cross-sectional view of the integrated circuit packaging system in an insulation phase of manufacturing.

Referring now to FIG. 11, therein is shown a cross-sectional view of the integrated circuit packaging system 100 in an insulation phase of manufacturing. The bottom portion 210 of each of the leads 206 can be insulated by depositing the solder resistant layer 230, such as an oxide layer or a solder resist. This is done without depositing the solder resistant layer 230 on the bottom contact plate 218. This process can leave the encapsulation 102 exposed between the non-solder wettable material on the bottom portion 210 of each of the leads 206.

The solder resistant layer 230 can be formed by depositing the non-solder wettable material on the leads 206. The solder resistant layer 230 can form shell shaped structures on the bottom portion 210 of each of the leads 206. The diameter of the solder resistant layer 230 decreases from near the encapsulation 102 to near the bottom contact plate 218.

Figure 12:
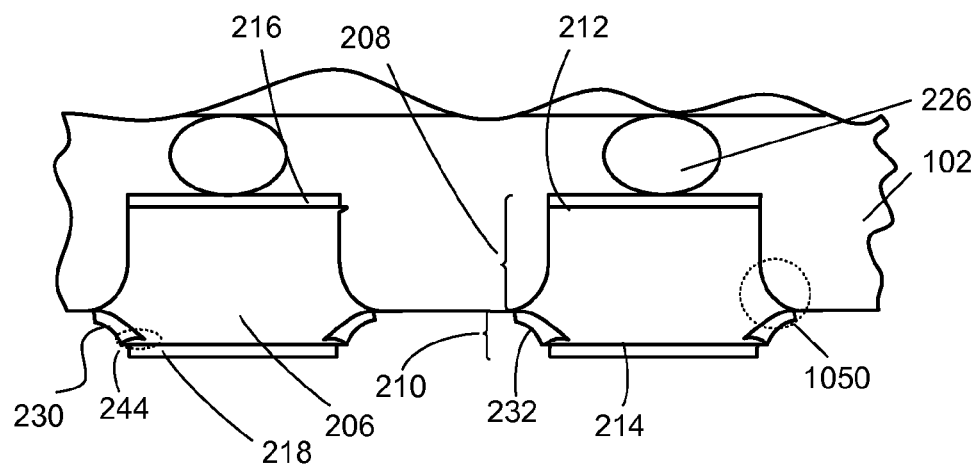
FIG. 12 is a detailed cross-sectional view of the leads of the integrated circuit packaging system 100 of FIG. 11.

Referring now to FIG. 12, therein is shown a detailed cross-sectional view of the leads 206 of the integrated circuit packaging system 100 of FIG. 11. The bottom portion 210 of each of the leads 206 have been separated by the etching process. The bottom portion 210 of each of the leads 206 now includes the protrusive extension 1050, such as a nub, between the upper portion 208 of each of the leads 206 and the bottom portion 210 of each of the leads 206.

The solder resistant layer 230 of FIG. 11 can have contour shell shapes, such as polygons, star shapes, or other contour shapes with the serrations 442 of FIG. 4. The solder resistant layer 230 of FIG. 11 can be on the bottom portion 210 of each of the leads 206 from the protrusive extension 1050 of FIG. 10, where it intersects with the encapsulation 102, towards the top surface 212. The solder resistant layer 230 of FIG. 11 generally has the same shell contour shape as the bottom portion 210 of each of the leads 206.

The bottom portion 210 of the leads 206 can form the second overhang portion 244, similar to the first overhang portion 248 of FIG. 2. The second overhang portion 244 can be on the bottom surface 214 of each of the leads 206. The bottom portion 210 of the leads 206 can also have contour shapes, such as star shapes, polygons, or shapes with serrations.

It has been discovered that the present invention provides the integrated circuit packaging system 100 having improve reliability by forming the second overhang portion 244. The second overhang portion 244 provides vertical interlocking with the solder resistant layer 230, preventing detachment. The described contour shapes provides additional contact surface with the solder resistant layer 230 to further interlock with the solder resistant layer 230. Attachment of the solder resistant layer 230 is essential to insulate each of the leads 206. The integrated circuit packaging system 100 thereby improve reliability by preventing detachment of the solder resistant layer 230.

It should be noted that the shapes and contour shapes that apply to the upper portion 208 of the leads 206 and the protrusions 304 of FIG. 3, the upper contact plate 216, and the top surface 212 of the leads 206 and the protrusions 304 all apply to its bottom portion equivalents, and vice versa.

Figure 13:
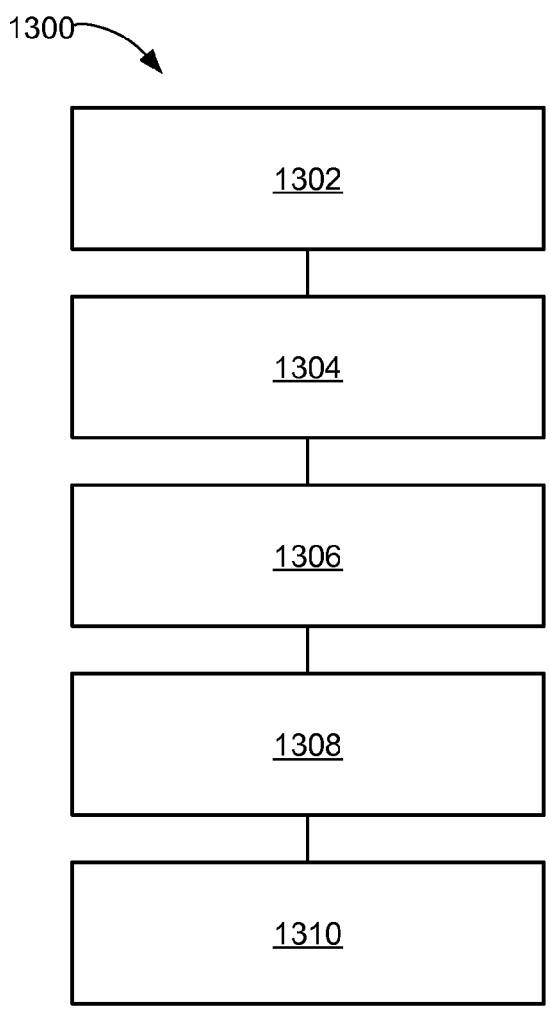
FIG. 13 is a flow chart of a method of manufacture of the integrated circuit packaging system in a further embodiment of the present invention.

Referring now to FIG. 13 therein is shown a flow chart of a method 1300 of manufacture of the integrated circuit packaging system in a further embodiment of the present invention. The method 1300 includes: forming a lead having an upper portion and a bottom portion with a first overhang portion from a top surface of the upper portion and the lead also having serrations along upper vertical sides intersecting the top surface in a block 1302; forming an upper contact plate on the top surface in a block 1304; forming a bottom contact plate on a bottom surface of the bottom portion in a block 1306; attaching an integrated circuit die over the upper portion in a block 1308; and encapsulating the upper portion and the integrated circuit die with an encapsulation leaving the bottom portion exposed in a block 1310.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

forming a lead having an upper portion and a bottom portion with a first overhang portion from a top surface of the upper portion and the lead also having serrations along upper vertical sides intersecting the top surface;

forming an upper contact plate on the top surface;

forming a bottom contact plate on a bottom surface of the bottom portion;

attaching an integrated circuit die over the upper portion; and encapsulating the upper portion and the integrated circuit die with an encapsulation leaving the bottom portion exposed.

2. The method as claimed in claim 1 wherein forming the lead includes:

forming a second overhang portion from the bottom surface of the lead.

3. The method as claimed in claim 1 wherein forming the lead includes:

forming the first overhang portion with the upper contact plate.

4. The method as claimed in claim 1 wherein:

forming the lead includes forming a second overhang portion from the bottom surface; and further comprising:

forming a solder resistant layer on the bottom portion around the bottom surface and supported by the second overhang portion.

5. The method as claimed in claim 1 wherein forming the lead includes:

forming a second overhang portion with the bottom contact plate.

6. A method of manufacture of an integrated circuit packaging system comprising:

forming a lead having an upper portion and a bottom portion with a first overhang portion from a top surface of the upper portion and the lead also having serrations along upper vertical sides intersecting the top surface;

forming an upper contact plate on the top surface;

forming a bottom contact plate on a bottom surface of the bottom portion;

attaching an integrated circuit die over an upper portion;

encapsulating the upper portion and the integrated circuit die with an encapsulation leaving the bottom portion of the lead exposed; and forming a solder resistant layer on the bottom portion of the lead around the bottom contact plate and the bottom surface.

7. The method as claimed in claim 6 wherein forming the lead includes forming a protrusive extension between the bottom portion and the upper portion of the lead.

8. The method as claimed in claim 6 wherein forming the lead includes forming the lead with more than four bottom vertical sides intersecting the bottom surface of the lead.

9. The method as claimed in claim 6 wherein forming the lead includes stamping the lead.

10. The method as claimed in claim 6 wherein forming the lead includes:

forming the lead with the serrations on bottom vertical sides intersecting the bottom surface of the lead.

11. An integrated circuit packaging system comprising:

a lead having an upper portion and a bottom portion with a first overhang portion from a top surface of the upper portion and the lead also having serrations along upper vertical sides intersecting the top surface;

an upper contact plate on the top surface;

a bottom contact plate on a bottom surface of the bottom portion;

an integrated circuit die mounted over the upper portion; and an encapsulation covering the upper portion and the integrated circuit die with the encapsulation leaving the bottom portion exposed.

12. The system as claimed in claim 11 wherein the lead includes a second overhang portion from the bottom surface of the lead.

13. The system as claimed in claim 11 wherein the first overhang portion of the lead includes the upper contact plate.

14. The system as claimed in claim 11 wherein:

the lead includes a second overhang portion from the bottom surface of the bottom portion; and further comprising:

a solder resistant layer on a bottom portion of the lead around the bottom surface and supported by the second overhang portion.

15. The system as claimed in claim 11 wherein the lead includes:

a second overhang portion with the bottom contact plate.

16. The system as claimed in claim 11 further comprising a solder resistant layer on the bottom portion of the lead around the bottom surface and the bottom contact plate.

17. The system as claimed in claim 16 wherein the lead includes a protrusive extension between the bottom portion and the upper portion of the lead.

18. The system as claimed in claim 16 wherein the lead includes the bottom surface having more than four bottom vertical sides intersecting the bottom surface.

19. The system as claimed in claim 16 wherein the lead has characteristics of a stamping process.

20. The system as claimed in claim 16 wherein the lead includes the serrations on bottom vertical sides intersecting the bottom surface of the lead.

* * * * *